(12) United States Patent
Leonov et al.

(10) Patent No.: US 11,499,071 B2
(45) Date of Patent: *Nov. 15, 2022

(54) POLISHING COMPOSITIONS AND METHODS OF USE THEREOF

(71) Applicant: Fujifilm Electronic Materials U.S.A., Inc., N. Kingstown, RI (US)

(72) Inventors: Alexei P. Leonov, Gilbert, AZ (US); Abhudaya Mishra, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/832,739

(22) Filed: Mar. 27, 2020

(65) Prior Publication Data

US 2020/0224058 A1    Jul. 16, 2020

Related U.S. Application Data

(63) Continuation of application No. 16/166,289, filed on Oct. 22, 2018, now Pat. No. 10,703,937, which is a continuation of application No. 15/472,788, filed on Mar. 29, 2017, now Pat. No. 10,106,705.

(51) Int. Cl.
| | |
|---|---|
| *C09G 1/02* | (2006.01) |
| *C09K 13/02* | (2006.01) |
| *H01L 21/321* | (2006.01) |
| *C09G 1/00* | (2006.01) |
| *C23F 1/10* | (2006.01) |

(52) U.S. Cl.
CPC ............. *C09G 1/02* (2013.01); *C09G 1/00* (2013.01); *C09K 13/02* (2013.01); *C23F 1/10* (2013.01); *H01L 21/3212* (2013.01)

(58) Field of Classification Search
CPC . C09G 1/00; C09G 1/02; C09K 13/02; C09K 3/14; C23F 1/10; C23F 1/32; H01L 21/3212; H01L 21/30625
USPC .... 252/79.1, 79.2, 79.3, 79.4; 438/691, 692, 438/693, 694; 216/88, 89, 90
See application file for complete search history.

(56) References Cited

U.S. PATENT DOCUMENTS

| | | | |
|---|---|---|---|
| 5,860,848 A | 1/1999 | Loncki et al. | |
| 6,063,306 A | 5/2000 | Kaufman et al. | |
| 6,114,249 A | 9/2000 | Canaperi et al. | |
| 6,159,786 A | 12/2000 | Chiang et al. | |
| 7,585,340 B2 | 9/2009 | Dysard et al. | |
| 8,697,576 B2 | 4/2014 | Reiss et al. | |
| 9,150,759 B2 | 10/2015 | Itai et al. | |
| 10,106,705 B1 | 10/2018 | Leonov et al. | |
| 2006/0117666 A1 | 6/2006 | Yoshida et al. | |
| 2009/0029633 A1 | 1/2009 | Carter et al. | |
| 2009/0156006 A1 | 6/2009 | Anjur et al. | |
| 2009/0156008 A1 | 6/2009 | Sakamoto | |
| 2009/0194504 A1* | 8/2009 | Sato | C09G 1/02 252/79.4 |
| 2010/0009538 A1 | 1/2010 | Kamimura | |
| 2010/0087065 A1 | 4/2010 | Boggs et al. | |
| 2010/0167546 A1 | 7/2010 | Shi et al. | |
| 2011/0062115 A1 | 3/2011 | Reiss et al. | |
| 2011/0136344 A1 | 6/2011 | Reiss et al. | |
| 2011/0180511 A1 | 7/2011 | Akatsuka et al. | |

(Continued)

FOREIGN PATENT DOCUMENTS

| | | | |
|---|---|---|---|
| CN | 1742066 | 3/2006 | ............... C09G 1/02 |
| CN | 101437918 | 5/2009 | ............... C09K 3/14 |

(Continued)

OTHER PUBLICATIONS

Taiwan Office Action for Taiwan Application No. TW 106113630 dated Jun. 11, 2020 with English summary.
International Search Report and the Written Opinion of the International Searching Authority for International Application No. PCT/US18/24543 dated Apr. 23, 2018 (12 pages).
Supplementary European Search Report for European Application No. EP 18 77 5533 dated Mar. 10, 2020.
Chinese Office Action for Chinese Application No. CN. 201880020925.9 dated May 26, 2021 (with English Translation).
Office Action issued in Chinese Application No. CN 201880020925.9 dated Dec. 2, 2020 (With English Translation).

(Continued)

*Primary Examiner* — Lan Vinh
(74) *Attorney, Agent, or Firm* — Fish & Richardson P.C.

(57) ABSTRACT

The disclosure provides chemical mechanical polishing compositions and methods for polishing polysilicon films with high removal rates. The compositions include 1) an abrasive; 2) at least one compound of structure (I):

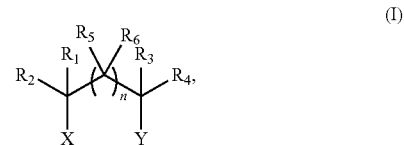

(I)

3) at least one compound of structure (II):

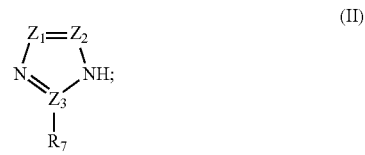

(II)

and 4) water; in which the composition does not include tetramethylammonium hydroxide or a salt thereof. The variables n, $R_1$-$R_7$, X, Y, and $Z_1$-$Z_3$ in structures (I) and (II) are defined in the Specification. The synergistic effect of the compounds of structures (I) and (II) in these chemical mechanical polishing compositions leads to high polysilicon films material removal rate during polishing.

70 Claims, No Drawings

(56) References Cited

U.S. PATENT DOCUMENTS

| | | | |
|---|---|---|---|
| 2011/0207327 A1 | 8/2011 | Suzuki et al. | |
| 2014/0054266 A1* | 2/2014 | Jin | B24B 1/00 |
| | | | 216/53 |
| 2014/0322913 A1 | 10/2014 | Yokota et al. | |
| 2015/0024595 A1 | 1/2015 | Dinega et al. | |
| 2015/0114928 A1* | 4/2015 | Chu | C23F 3/00 |
| | | | 216/53 |
| 2016/0153095 A1* | 6/2016 | Yoshizaki | C09K 3/1436 |
| | | | 252/79.2 |
| 2017/0037278 A1 | 2/2017 | Masuda et al. | |
| 2019/0055431 A1 | 2/2019 | Leonov et al. | |

FOREIGN PATENT DOCUMENTS

| | | | |
|---|---|---|---|
| CN | 104131293 | 11/2014 | ............. C23F 3/00 |
| JP | H 10-321569 | 12/1998 | ........... H01L 21/304 |
| JP | 2004-266155 | 9/2004 | ........... H01L 21/304 |
| JP | 2006-520530 | 9/2006 | ........... H01L 21/304 |
| JP | 2007-180451 | 7/2007 | ........... H01L 21/304 |
| JP | 2014-051576 | 3/2014 | ............. C09K 3/14 |
| TW | 200815571 | 4/2008 | ............ B24B 37/00 |
| WO | WO 2010/052990 | 5/2010 | ........... H01L 21/304 |
| WO | WO 2014/123126 | 8/2014 | |

OTHER PUBLICATIONS

Office Action issued in Japanese Application No. JP 2017-119671 dated Nov. 30, 3030 (with English Translation).

Office Action and Search Report issued by the Taiwan Patent Office for Application No. TW 110117521 dated May 25, 2022 (With English Translation).

* cited by examiner

POLISHING COMPOSITIONS AND METHODS OF USE THEREOF

CROSS-REFERENCE TO RELATED APPLICATIONS

The present application is a continuation of U.S. application Ser. No. 16/166,289, filed on Oct. 22, 2018, which is a continuation of U.S. application Ser. No. 15/472,788, filed on Mar. 29, 2017, now U.S. Pat. No. 10,106,705. The contents of the parent applications are hereby incorporated by reference in their entirety.

FIELD OF THE DISCLOSURE

The present disclosure relates generally to polishing compositions, and methods for polishing semiconductor substrates using the compositions described herein. More particularly, the disclosure relates to chemical mechanical polishing compositions and methods for removing polysilicon layers from a semiconductor substrate.

BACKGROUND OF THE DISCLOSURE

Chemical mechanical polishing compositions are used in the semiconductor industry in a process step called chemical mechanical polishing/planarization (CMP). Along with photolithographic patterning and deposition, CMP is one of the three key enabling process steps in integrated circuit (IC) manufacturing process flow. Modern ICs are built in a parallel fashion, typically, hundreds at a time, on the surface of a common silicon wafer substrate. Photolithography, deposition, CMP and multiple auxiliary steps, are iteratively applied to the wafer surface where the evolving IC structures are located, until the final IC device is finished and the wafer is ready to be cut into individual dies (chips) for packaging.

SUMMARY OF THE DISCLOSURE

One purpose of the CMP step in this technology process flow is to reduce the overburden from the preceding deposition step to a specified layer thickness determined by the integration scheme, and to create a flat wafer surface to enable subsequent photolithography steps. CMP achieves this by polishing the wafer surface in a mechanical polisher. The polishing process involves holding the wafer in a rotating chuck (called the polishing head) and pressing the wafer against a compliant, felt-like polishing pad rotating on the polishing table (the platen), with a pre-selected pressure (the downforce), while applying an abrasive containing slurry (i.e., a chemical mechanical polishing composition) between the wafer surface and the polishing pad.

Some of the generally desired performance metrics for a CMP process based on a specific chemical mechanical polishing composition are: 1) high removal rates related to fab throughput efficiency; 2) high polishing selectivity related to the ability of the CMP process to stop on certain materials chosen as stop layers within the device layer stack; 3) low levels of defects (scratches, debris, leftover abrasive particles) related to enhancing the final device yield; and 4) uniform material removal across the wafer surface, which is related to the resultant wafer being suitably flat for subsequent photolithography steps. Uniform material removal within the die and across the wafer is also important for within-the-die and within-the-wafer device performance reproducibility and reliability.

Polycrystalline silicon, or polysilicon (P—Si), is a material widely used in the semiconductor industry for IC manufacturing in both logic and memory integration schemes in different roles, which range, depending on doping, from a conductor to an insulator. Within the integration schemes for logic applications, it is widely used as a gate electrode material for MOSFET/FinFET-type devices. On the memory side, polysilicon is used as part of the capacitor, gate, and contact plug structures as seen, for example, in DRAM integration. Silicon nitride (SiN) is another common material used in IC manufacturing. It is a versatile dielectric used where the default dielectric material, namely, silicon oxide, cannot be used due to various functional, or process limitations. On the logic side of the semiconductor industry, silicon nitride is widely used as the gate insulating material, and on the memory side, particularly in DRAM, it is typically used as the capacitor material. U.S. Pat. No. 4,897,702 gives an example of a DRAM (type of memory) device using P—Si and SiN in the above-described capacities.

One of the requirements for polysilicon CMP in modern DRAM process flows is high polysilicon removal rates (e.g., >8000 A/min) at low-to-intermediate downforce pressures (<3 psi). The high polysilicon removal rate is dictated by the need to remove exceedingly high polysilicon overburden within a short process time. Reduction of polishing process time is an important way of enhancing the fab manufacturing throughput efficiency. The need for a relatively low downforce pressure comes from the drive to minimize scratch defects associated with the use of higher downforce pressures, and maximize the functional stopping layer thickness retention/budget critical for the device performance.

In the case of DRAM applications, as the stopping layer is typically silicon nitride, another requirement for the DRAM polysilicon CMP process is high polysilicon-to-silicon nitride removal rate selectivity (e.g., >100:1). This level of rate selectivity ensures that, during the DRAM polysilicon CMP step, polysilicon is removed rapidly until the underlying silicon nitride layer is exposed, at which point the polishing process is stopped with minimum loss of the silicon nitride layer. The retention/minimization of loss of SiN is needed to ensure proper capping/encapsulation of the device with the insulator SiN dielectric. This, thus, improves electrical and overall DRAM device performance.

In addition to high polysilicon removal rates and low silicon nitride removal rates, the semiconductor industry presents a set of additional challenging requirements for polysilicon chemical mechanical polishing compositions. These additional requirements include: 1) low health hazard to promote chemical safety at the work place; and 2) low cost of ownership (COO), or, simply, a low cost of a chemical mechanical polishing composition, achieved by making the composition dilutable. Cost of ownership (COO) has emerged as an important business consideration for chemical mechanical polishing compositions in response to the continued efforts to reduce costs and improve business efficiency.

An important way to improve COO for a chemical mechanical polishing composition is to make the composition dilutable, such that the chemical mechanical polishing composition supplier provides a concentrated version of the polishing composition, and the customer dilutes the chemical mechanical polishing composition to a specified dilution level prior to use. Typical dilution levels vary widely from 2× to, in some cases, greater than 10×.

With respect to health and chemical safety, reduction of employee exposure to chemical hazards and toxic substances can ensure chemical safety and minimize adverse health effects at the work place. The Global Harmonized System (GHS) of classification of hazardous substances mandated in the US by OSHA Hazard Communication Standard 29CFR1910.1200 provides a framework for understanding and communicating the level of health hazard associated with various chemicals. Chemicals with acute toxicity are grouped in categories, with Category 1 indicating the highest health hazard, while Category 5 indicates the lowest health hazard.

Virtually excluded are the substances classified as GHS Category 1 and 2 carcinogens, GHS Category 1 and 2 reproductive hazards, substances with GHS Category 1 and 2 acute toxicity, and GHS Category 1 and 2 sensitizers. There is substantial pressure on the suppliers of consumables for the semiconductor industry to formulate their products excluding the hazardous substances from the GHS categories listed above.

Semiconductor manufacturers continue to restrict the use of hazardous chemicals in their fabs, particularly, in their CMP modules. The CMP module (as opposed to Etch, Lithography, etc.) is particularly sensitive to hazardous chemicals because there are very few engineering controls to prevent the amount of hazardous chemical release to the waste-water stream. Typically, the CMP polisher equipment has its plumbing tied-in to public waste-water stream. Once the fabs polish wafers, the post-polishing CMP slurry is released to public waste-water stream. Thus, these hazardous chemicals are responsible for contaminating the public waste-water near the fabs. Each city's Environmental Health and Safety (EHS) monitor the waste-water discharge of these fabs on a daily basis. Thus, it is desirable by all fabs to have limited to no exposure of hazardous chemicals in the CMP slurries of the vendors. Other modules such as Etch modules can isolate the chemical waste, which can then be sent off-site for proper chemical disposal. As such, they typically do not face the environmental issues that the CMP vendors face.

In addition to abrasive nanoparticles, components of known polysilicon chemical mechanical polishing compositions are chemical additives promoting polysilicon removal rates through chemical reactions with the polysilicon film. Traditionally, and historically, tetramethylammonium hydroxide (TMAH) has been the chemical additive of choice in chemical mechanical polishing compositions designed for high polysilicon and single-crystal silicon removal rate. For example, US Patent Application Pub. No. 2009/0156008 (Sakamoto, et al.) describes a chemical mechanical polishing composition containing about 0.28% TMAH at point of use (POU), demonstrating single-crystal silicon material removal rates on the order of 10,000 A/min. U.S. Pat. No. 8,697,576 (Reiss, et al.) describes a polysilicon chemical mechanical polishing composition containing 0.25% TMAH at POU, demonstrating polysilicon removal rates of about 4,500 A/min.

Although an efficient promoter of polysilicon and single-crystal silicon removal rate, TMAH is classified as a substance with acute oral and dermal toxicity (GHS Category 2), and with specific target organ (e.g., central nervous system, thymus gland, or liver) toxicity (GHS Category 1). TMAH has been involved in multiple high-profile industrial accidents with three combined fatalities [Lin, Chun-Chi, et al, 2010, Clinical Toxicology (48), 3, 213-217]. Thus, there is a desire for TMAH-free chemical mechanical polishing compositions for polysilicon CMP. Many fabs also complain about TMAH getting into their city's waste-water stream and the city officials requesting that TMAH be banned in the CMP slurry module of the fabs.

The present disclosure provides chemical mechanical polishing formulations and methods for use thereof demonstrating very high polysilicon removal rates (e.g., in excess of 8000 A/min), and high selectivity with respect to silicon nitride (e.g., having polysilicon-to-silicon nitride removal rate ratios of >100:1). Moreover, most of the components of the chemical mechanical polishing compositions described herein are generally of low health hazard (e.g., classified as a GHS Category 3 or above). In some embodiments, the chemical mechanical polishing compositions of the disclosure contain no compounds with the health hazards not permitted in the CMP modules of semiconductor fabs (e.g., GHS Category 1 and 2 carcinogens, GHS Category 1 and 2 reproductive hazards, substances with GHS Category 1 and 2 acute toxicity, and GHS Category 1 and 2 sensitizers). In addition, the chemical mechanical polishing compositions of the disclosure provide low cost of ownership (COO) by being at least 2× dilute-able.

In some embodiments, the disclosure features chemical mechanical polishing compositions including 1) at least one abrasive; 2) at least one compound of structure (I):

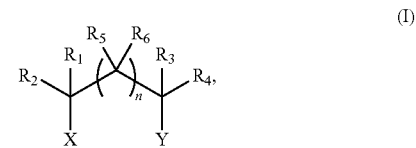

in which n is 0, 1, 2, or 3; each of X and Y, independently, is $O(R_a)$, $CH_2(R_a)$, or $NH(R_a)$, provided that at least one (e.g., both) of X and Y is $O(R_a)$ or $NH(R_a)$, in which each $R_a$, independently, is H or $C_1$-$C_3$ alkyl optionally substituted by hydroxyl or $NH_2$, and each of $R_1$-$R_6$, independently, is H, OH, or $C_1$-$C_3$ alkyl optionally substituted by OH or $NH_2$; 3) at least one compound of structure (II):

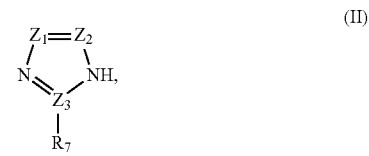

in which each of $Z_1$ and $Z_2$, independently, is —$CR_8$— or —N—, in which $R_8$ is H, $N(R_b)_2$, COOH, $C_1$-$C_3$ alkyl; each $R_b$, independently, being H or $C_1$-$C_3$ alkyl; or $Z_1$ and $Z_2$ together form a 5-6 membered ring fused with the 5-membered ring in Structure (II); $Z_3$ is —C— or —N—; and $R_7$ is H, COOH, $C_1$-$C_3$ alkyl or $N(R_9)_2$, in which each $R_9$, independently, is H or $C_1$-$C_3$ alkyl; provided that, when $Z_3$ is —N—, $R_7$ is deleted; and 4) water. The composition does not include tetramethylammonium hydroxide or a salt thereof.

In some embodiments, this disclosure features methods for polishing polysilicon film exposed on the surface of a wafer substrate by treating the polysilicon film with a chemical mechanical polish composition described herein. Such methods can be performed, for example, by A) placing the wafer in a polisher equipped with a polishing pad, and B) polishing the wafer with the polishing pad in the presence of a chemical mechanical polishing composition described herein.

DETAILED DESCRIPTION OF THE DISCLOSURE

The chemical mechanical polishing compositions set forth in this disclosure contain abrasives that are generally insoluble in water. Therefore, the compositions of the disclosure may be referred to as slurries. For the purposes of this disclosure, the terms "composition" and "slurry" and "compositions" and "slurries" are used interchangeably.

The chemical mechanical polishing compositions described herein provide high polysilicon removal rates (e.g., at least 8000 Å/min) and high polysilicon-to-silicon nitride removal rate selectivity (at least 50:1) while employing components characterized by having low health hazards. The chemical mechanical polishing compositions of the disclosure may be used as replacements for analogous products containing tetramethylammonium hydroxide (TMAH) as the promoter of polysilicon removal rate, which is a recognized health hazard due to its high toxicity.

Without wishing to be bound by theory, it is believed that the high polysilicon removal rates (at least 8000 Å/min) and/or high polysilicon-to-silicon nitride removal rate ratios (e.g., at least 50:1) provided by the chemical mechanical polishing compositions of the disclosure is achieved due to a synergistic effect during polishing between the compound of structure (I) and the compound of structure (II). Although the mechanism of this effect is not entirely clear, as the examples herein illustrate, high polysilicon removal rates and/or high polysilicon-to-silicon nitride removal rate ratios are observed when both components are present in the polishing formulation. In some embodiments, if either one is omitted, the resultant polysilicon removal rates and/or polysilicon-to-silicon nitride removal rate ratios can be significantly lower.

In some embodiments, the disclosure features chemical mechanical polishing compositions including 1) at least one abrasive; 2) at least one compound of structure (I):

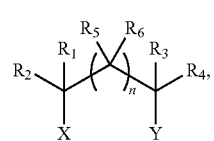

(I)

in which n is 0, 1, 2, or 3; each of X and Y, independently, is $O(R_a)$, $CH_2(R_a)$, or $NH(R_a)$, provided that at least one (e.g., both) of X and Y is $O(R_a)$ or $NH(R_a)$, in which each $R_a$, independently, is H or $C_1$-$C_3$ alkyl optionally substituted by hydroxyl or $NH_2$, and each of $R_1$-$R_6$, independently, is H, OH, or $C_1$-$C_3$ alkyl optionally substituted by OH or $NH_2$; 3) at least one compound of structure (II):

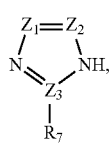

(II)

in which each of $Z_1$ and $Z_2$, independently, is —$CR_8$— or —N—, in which $R_8$ is H, $N(R_b)_2$, COOH, $C_1$-$C_3$ alkyl; each $R_b$, independently, being H or $C_1$-$C_3$ alkyl; or $Z_1$ and $Z_2$ together form a 5-6 membered ring fused with the 5-membered ring in Structure (II); $Z_3$ is —C— or —N—; and $R_7$ is H, COOH, $C_1$-$C_3$ alkyl or $N(R_9)_2$, in which each $R_9$, independently, is H or $C_1$-$C_3$ alkyl; provided that, when $Z_3$ is —N—, $R_7$ is deleted; and 4) water. The composition does not include tetramethylammonium hydroxide or a salt thereof.

As used herein, the term "$C_{1-3}$ alkyl" refers to a saturated hydrocarbon group that can be straight-chained or branched and can have 1 to 3 carbons, such as methyl, ethyl, propyl, or isopropyl.

In some embodiments, n in formula (I) is 0. In such embodiments, Y can be $NH(R_a)$, in which $R_a$ is H or $C_1$-$C_3$ alkyl optionally substituted by hydroxyl (e.g., hydroxylethyl); X can be $O(R_a)$, in which $R_a$ is H or $C_1$-$C_3$ alkyl optionally substituted by hydroxyl (e.g., hydroxylethyl); $R_1$ can be H; $R_2$ can be H or $C_1$-$C_3$ alkyl (e.g., methyl or ethyl); $R_3$ can be H, and $R_4$ can be H or $C_1$-$C_3$ alkyl (e.g., methyl). In some embodiments, when n is 0 and each of $R_1$-$R_4$ is H, at least one of X and Y is OH.

In some embodiments, n in formula (I) is 1. In such embodiments, Y can be $NH(R_a)$, in which $R_a$ is $C_1$-$C_3$ alkyl optionally substituted by hydroxyl (e.g., hydroxylethyl); X can be OH or $NH_2$; $R_1$ can be H; $R_2$ can be H; $R_3$ can be H; $R_4$ can be H; $R_5$ can be H or $C_1$-$C_3$ alkyl (e.g., methyl); and $R_6$ can be H, OH, and or $C_1$-$C_3$ alkyl (e.g., methyl or ethyl).

In some embodiments, at most one of $R_1$-$R_4$ or $R_1$-$R_6$ in formula (I) is OH or $C_1$-$C_3$ alkyl optionally substituted by OH or $NH_2$. For example, when n in formula (I) is 0, X is $O(R_a)$, and Y is $NH(R_a)$, $R_1$-$R_3$ can be H and R4 can be $C_1$-$C_3$ alkyl (e.g., methyl or ethyl) optionally substituted by OH or $NH_2$. Examples of such amines include 1-amino-2-propanol and 1-amino-2-butanol. In some embodiments, when X is $NH(R_a)$ and Y is $O(R_a)$, one of $R_3$ and $R_4$ is OH or $C_1$-$C_3$ alkyl optionally substituted by OH or $NH_2$; and the other of $R_3$ and $R_4$ is H.

In some embodiments, the compound of structure (I) is an aminoalcohol. Exemplary aminoalcohols contemplated for use in the practice of the disclosure include, but are not limited to, monoethanolamine, diethanolamine, 1-amino-2-propanol, 1-amino-2-butanol, 1,3-diamino-2-propanol, 3-amino-1,2-propanediol, 3-amino-1-propanol, 2-(2-aminoethoxy)ethanol, 2-amino-3-methyl-1-butanol, 5-amino-1-pentanol, and the like.

In some embodiments, the compound of structure (I) is a diamine. Exemplary diamines contemplated for use in the practice of the disclosure include, but are not limited to, 2,2-dimethyl-1,3-propane diamine, 1,3-diaminopentane, 2-(3-aminopropylamino)ethanol, and the like.

In some embodiments, the compound of structure (I) is in an amount of at least about 0.1 wt % (e.g., at least about 0.25 wt %, at least about 0.5 wt %, at least about 0.6 wt %, at least about 0.7 wt %, at least about 0.8 wt %, at least about 0.9 wt %, at least about 1 wt %, at least about 1.25 wt %, at least about 1.5 wt %, at least about 1.75 wt %, at least about 2 wt %, or at least about 2.5 wt %, or at least about 3 wt %) to at most about 15 wt % (e.g., at most about 12.5 wt %, at most about 10 wt %, at most about 7.5 wt %, at most about 5 wt %, at most about 4 wt %, at most about 3 wt %, or at most about 2 wt %) of the CMP composition, either in a concentrated form or in a diluted, point of use (POU) slurry.

In some embodiments, when $Z_3$ in formula (II) is —C—, one of $Z_1$ and $Z_2$ can be —N—. In such embodiments, $Z_1$ can be —N—; $Z_2$ can be —$CR_8$—, in which $R_8$ is H or $NH_2$; and $R_7$ can be $NH_2$ or COOH. In some embodiments, when $Z_3$ in formula (II) is —C—, both of $Z_1$ and $Z_2$ can be —N—. In such embodiments, $R_7$ can be $NH_2$.

In some embodiments, the compound of structure (II) is a triazole. Exemplary triazoles contemplated for use in the practice of the disclosure include, but are not limited to, benzotriazole, 3-amino 1,2,4-triazole, 3,5-diamino-1,2,4-triazole, 1,2,4-triazole-3-carboxylic acid, and the like.

In some embodiments, the compound of structure (II) is a tetrazole. Exemplary tetrazoles contemplated for use in the practice of the disclosure include, but are not limited to, 5-(aminomethyl)tetrazole, 5-methyl-1H-tetrazole, 5-aminotetrazole (ATA), their hydrates (e.g., monohydrates), and the like.

It is understood that tautomeric forms of the azoles of structure (II) rapidly interconvert in the aqueous chemical mechanical polishing compositions described herein and are thus equivalent to one another. All tautomeric forms of the azoles described herein are contemplated for use in the CMP compositions described herein.

In some embodiments, the compound of structure (II) is in an amount of at least about 0.1 wt % (e.g., at least about 0.2 wt %, at least about 0.3 wt %, at least about 0.4 wt %, at least about 0.5 wt %, at least about 0.6 wt %, at least about 0.7 wt %, at least about 0.8 wt %, at least about 0.9 wt %, at least about 1 wt %, at least about 1.25 wt %, at least about 1.5 wt %, at least about 1.75 wt %, or at least about 2 wt %) to at most about 15 wt % (e.g., at most about 12.5 wt %, at most about 10 wt %, at most about 7.5 wt %, at most about 5 wt %, at most about 4 wt %, at most about 3 wt %, at most about 2 wt %, at most about 1 wt %, at most about 0.9 wt %, at most about 0.8 wt %, at most about 0.7 wt %, at most about 0.6 wt %, or at most about 0.5 wt %) of the CMP composition, either in a concentrated form or in a diluted, point of use (POU) slurry.

In some embodiments, the abrasives contemplated for use include alumina, fumed silica, colloidal silica, coated particles, titania, ceria, zirconia, and any combinations thereof. In some embodiments the abrasive is colloidal silica.

In addition, silica particles contemplated for use include sol-gel-derived colloidal silica without surface modification, and sol-gel-derived colloidal silica with surface modification. The surface modified silica can be anionic silica or cationic silica. The silica particles may include colloidal silica particles with isotropic spherical morphology characterized by primary particle diameter d1, or colloidal silica particles with aggregate morphology (predominantly fused dimers and trimers) characterized by primary and secondary particle diameters d1 and d2. In some embodiments, the silica morphology type is the aggregate morphology with primary particle diameter d1 of less than 80 nm but greater than 10 nm, and secondary particle diameter d2 of less than 160 nm but greater than 20 nm.

As demonstrated in the examples, it is believed that an important factor responsible for the high performance of the chemical mechanical polishing compositions described herein is an unexpected synergy of the compounds of structure (I) and structure (II).

In some embodiments, the abrasive is in an amount of at least about 0.0.05 wt % (e.g., at least about 0.10 wt %, at least about 0.25 wt %, at least about 0.5 wt %, at least about 0.75 wt %, at least about 1 wt %, at least about 1.25 wt %, at least about 1.5 wt %, at least about 1.75 wt %, at least about 2 wt %, at least about 2.5 wt %, or at least about 3 wt %) to at most about 20 wt % (e.g., at most about 15 wt %, at most about 12.5 wt %, at most about 10 wt %, at most about 7.5 wt %, at most about 5 wt %, at most about 4 wt %, at most about 3 wt %, at most about 2 wt %, or at most about 1 wt %) of the CMP composition, either in a concentrated form or in a diluted, point of use (POU) slurry.

In some embodiments, the chemical mechanical polishing compositions described herein can include at least one aminophosphonic acid. Examples of suitable aminophosphonic acids include, but are not limited to, ethylenediamine tetra(methylene phosphonic acid), amino tri(methylene phosphonic acid) (also referred to as aminotris(methanephosphonic acid)), diethylenetriamine penta(methylene phosphonic acid), and salts thereof. Commercially available examples of the aminophosphonic acid include DEQUEST series of products available from Italmatch Chemicals S.P.A. (Arese, Italy). In some embodiments, the aminophosphonic acid is in an amount of at least about 0.01 wt % (e.g., at least about 0.05 wt %, at least about 0.1 wt %, at least about 0.25 wt %, at least about 0.5 wt %, at least about 0.75 wt %, or at least about 1 wt %) to at most about 5 wt % (e.g., at most about 4 wt %, at most about 3 wt %, at most about 2 wt %, or at most about 1 wt %) of the CMP composition, either in a concentrated form or in a diluted, point of use (POU) slurry. Without wishing to be bound by theory, it is believed that such aminophosphonic acids can further enhance the performance (e.g., the polysilicon removal rate, the polysilicon-to-silicon nitride removal selectivity, or both) of the CMP compositions described herein.

In some embodiments, the chemical mechanical polishing compositions described herein can further include one or more low health hazard salts containing a zwitterion (e.g., classified as a GHS Category 3 or above). In some embodiments, the salts can contain a sulfonate group, an amino group, a carboxylate group, or a tetraalkylammonium group, where the salts containing a tetraalkylammonium group is different from a salt of tetramethylammonium hydroxide. Examples of salts that can be used for this purpose include, but are not limited to, various amino acids, such as glycine, taurine, choline hydroxide, and the like. In some embodiments, the salt is in a mount of at least about 0.05 wt % (e.g., at least about 0.1 wt %, at least about 0.2 wt %, at least about 0.3 wt %, at least about 0.4 wt %, at least about 0.5 wt %, at least about 0.6 wt %, at least about 0.7 wt %, at least about 0.8 wt %, at least about 0.9 wt %, or at least about 1 wt %) to at most about 5 wt % (e.g., at most about 4 wt %, at most about 3 wt %, at most about 2 wt %, at most about 1.9 wt %, at most about 1.8 wt %, at most about 1.7 wt %, at most about 1.6 wt %, at most about 1.5 wt %, at most about 1.4 wt %, at most about 1.3 wt %, at most about 1.2 wt %, at most about 1.1 wt %, or at most about 1 wt %) of the CMP composition described herein, either in a concentrated form or in a diluted, point of use (POU) slurry. In some embodiments, the upper limit of the salt concentration can be the concentration of the 2x-dilutable concentrate of the formulation. In some embodiments, the concentration of glycine can be about 0.75 wt % and the concentration of choline hydroxide can be about 0.5 wt %. Without wishing to be bound by theory, it is believed that such salts can further enhance the performance (e.g., the polysilicon removal rate, the polysilicon-to-silicon nitride removal selectivity, or both) of the CMP compositions described herein.

Concentrate-ability (also referred to as "dilute-ability") is one of the requirements set by the semiconductor manufacturers for any modern chemical mechanical polishing composition, intended to reduce the cost of ownership (COO) of the manufacturing consumable. The chemical mechanical polishing compositions described herein can be used as an at least 2x-dilutable concentrate mixture. In other words, the chemical mechanical polishing compositions can be diluted at least 2-fold (e.g., at least 3-fold, at least 4-fold, at least 5-fold, or at least 10-fold) prior to use by the end user. The chemical mechanical polishing compositions of the disclosure can include 0.05-20 weight percent (e.g., 2-3 weight percent) abrasives in a 2x concentrate composition mixture.

In addition, in some embodiments, the chemical mechanical polishing compositions of the disclosure can contain one or more additives, such as, pH adjusting agents, corrosion inhibitors, surfactants, organic solvents, and defoaming agents as optional components.

In some embodiments, the chemical mechanical polishing compositions of the disclosure include at least one pH adjusting agent. The pH adjusting agent can bring the chemical mechanical polishing compositions into the operational pH range. A variety of basic pH adjusting agents are contemplated for use, including, but not limited to, potassium hydroxide, ammonium hydroxide, sodium hydroxide, cesium hydroxide, triethanol amine, tetrabutyl ammonium hydroxide, or any combinations thereof.

In some embodiments, water is in an amount of at least about 50 wt % (e.g., at least about 55 wt %, at least about 60 wt %, at least about 65 wt %, at least about 70 wt %, at least about 75 wt %, at least about 80 wt %, at least about 85 wt %, at least about 90 wt %, at least about 95 wt %, or at least about 97 wt %) to at most about 99 wt % (e.g., at most about 95 wt %, at most about 90 wt %, at most about 85 wt %, at most about 75 wt %, at most about 70 wt %, at most about 65 wt %, at most about 60 wt %, or at most about 55 wt %) of the CMP composition, either in a concentrated form or in a diluted, point of use (POU) slurry.

In some embodiments, the CMP compositions of the disclosure can have a pH of at least about 7 (e.g., at least about 7.5, at least about 8, at least about 8.5, at least about 9, at least about 9.5, or at least about 10) to at most of 12 (e.g., at most about 11.5, at most about 11, at most about 10.5, or at most about 10). Without wishing to be bound by theory, it is believed that CMP compositions that do not have the above pH may not be able to achieve a high polysilicon removal rate, a high polysilicon-to silicon nitride removal rate ratio, or both.

In some embodiments, when the CMP compositions of the disclosure are diluted, at least one oxidizing agent can be added to the composition. Oxidizing agents contemplated for use in the compositions of the disclosure include, but are not limited to, hydrogen peroxide, ammonium persulfate, silver nitrate (AgNO$_3$), ferric nitrates or chlorides, peracids or salts thereof, ozone water, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, KMnO$_4$, other inorganic or organic peroxides, or mixtures thereof. In some embodiments, the oxidizing agent can be hydrogen peroxide. The oxidizing agent can be present in an amount of about 0.1 wt % to about 5 wt % (e.g., from about 0.4 wt % to about 2 wt %) of the composition, either in a concentrated form or in a diluted, point of use (POU) slurry. In some embodiments, the CMP compositions described herein can exclude the oxidizing agent described above.

In some embodiments, the CMP compositions of the disclosure can exclude certain components, such as tetramethylammonium hydroxide or a salt thereof, an oxidizing agent (such as those described above), a bicarbonate salt (e.g., potassium bicarbonate or ammonium bicarbonate), a carbonate salt (e.g., guanidine carbonate), a health hazardous chemical classified as a GHS Category 1 or 2 (e.g., ethylene diamine, piperazine, 1,3-diaminopropane, imidazole, 1,2,4-triazole, or 3-amino-1,2,4-trizole), and/or a compound having a boiling point less than 50° C. (e.g., propylamine or isopropylamine).

In general, the CMP compositions of the disclosure can have a relatively high polysilicon removal rate. In some embodiments, the CMP compositions of the disclosure can have a polysilicon removal rate of from at least about 8,000 Å/minute (e.g., at least about 8,500 Å/minute, at least about 9,000 Å/minute, at least about 9,500 Å/minute, at least about 10,000 Å/minute, at least about 10,500 Å/minute, at least about 11,000 Å/minute, at least about 11,500 Å/minute, or at least about 12,000 Å/minute) to at most about 15,000 Å/minute (e.g., at most about 14,000 Å/minute or at most about 13,000 Å/minute). As mentioned herein, the polysilicon removal rates are measured at a polishing downforce pressure of 2.5 psi.

In general, the CMP compositions of the disclosure can have a relatively high polysilicon-to-silicon nitride removal selectivity (e.g., relatively high polysilicon-to-silicon nitride removal rate ratio). In some embodiments, the CMP compositions of the disclosure can have a polysilicon-to-silicon nitride removal rate ratio of from at least about 50:1 (e.g., at least about 75:1, at least about 100:1, at least about 110:1, at least about 120:1, at least about 130:1, at least about 140:1, or at least about 150:1) to at most about 200:1 (e.g., at most about 180:1 or at most about 150:1). As mentioned herein, the polysilicon-to-silicon nitride removal rate ratios/selectivities are measured at a polishing downforce pressure of 2.5 psi.

In general, the components (e.g., the abrasives, the compounds of structures (I) and (II), the aminophosphonic acid, and the additives) of the CMP compositions described in this disclosure can be obtained from commercial sources or can be synthesized by methods known in the art.

In some embodiments, this disclosure features methods for polishing polysilicon film exposed on the surface of a wafer substrate that include the step of treating the polysilicon film with a chemical mechanical polishing composition described herein. Such methods can be performed, for example, by A) placing the wafer in a polisher equipped with a polishing pad, B) contacting the wafer with the polishing pad in the presence of a chemical mechanical polishing composition described herein. In some embodiments, the CMP compositions can be diluted with DI water (e.g., at least 2-fold, at least 3-fold, at least 4-fold, at least 5-fold, or at least 10-fold) prior to the treating or contacting the polysilicon film with the CMP compositions. Other components and/or steps used in the above CMP methods are either described below or are known in the art.

The contents of all publications cited herein (e.g., patents, patent application publications, and articles) are hereby incorporated by reference in their entirety.

The following examples are intended to further illustrate the subject matter of this disclosure and should in no way be construed as limiting the disclosure.

EXAMPLES

The chemical mechanical polishing compositions in the examples below were prepared according to the description accompanying each example. The polishing tests to obtain polysilicon and silicon nitride removal rates with each chemical mechanical polishing composition from the examples below were performed as follows.

Two hundred-millimeter polysilicon and silicon nitride wafers were polished for 60 seconds each using an Applied Materials Mirra polisher equipped with a VISIONPAD™ 6000 polishing pad available from the DOW Chemical Company, with a down force of 2.5 psi, a chemical mechanical polishing composition flow rate of 200 ml/min, a platen rotation speed of 120 rpm and a carrier head rotation speed of 114 rpm. The silicon and silicon nitride material removal rates were determined by subtracting the post-polish silicon or silicon nitride film thickness on the blanket wafer from the pre-polish film thickness on the same blanket wafer, and dividing the difference by the polish time. The film thickness values were the average of 29 film thickness measurements taken across the wafer using a Filmetrics F80C ellipsometer instrument. The polysilicon-to-silicon nitride removal rate ratios for each chemical mechanical polishing composition was determined by dividing the polysilicon removal rate by the silicon nitride removal rate obtained from polishing the corresponding blanket wafers with the chemical mechanical polishing composition in question.

Example 1

This example compares the polishing performance of comparative chemical mechanical polishing compositions that do not contain compounds of structure (I) (i.e., C-1A through C-1D, Table 1.1) to chemical mechanical polishing compositions of the disclosure (i.e., 1E, 1F, 1G, and 1H).

The chemical mechanical polishing compositions C-1A through C-1D and 1E through 1H each contained amine compound 1A through 1H listed in Table 1.1, 5-aminotetrazole monohydrate, aminotris(methanephosphonic acid), high-purity colloidal silica, and potassium hydroxide to adjust pH of the mixture to a final value of 10.8. The polysilicon and silicon nitride removal rates were determined in polishing tests P-1A through P-1F (comparative) and P-1G and P-1H (present disclosure) in Table 1.2 using chemical mechanical polishing compositions C-1A through C-1D and 1E through 1H from Table 1.1. The test results are summarized in Table 1.2.

The examples demonstrate the advantage of the amines of structure (I), where X is an alkyl, hydroxyl, or substituted hydroxyl, and Y is an amino group (1E, 1F, 1G, and 1H), over other amine structures with a structure different from structure (I).

For example, the results in Table 1.2 demonstrate that chemical mechanical polishing composition 1F containing an amine with structure (I), where X is a hydroxylethoxy, Y is an amino group, and n=0, namely, 2-(2-aminoethoxy) ethanol, and an azole with structure (II), wherein $Z_1=Z_2=N$; $Z_3$ is C and $R_7$ is $NH_2$, namely, 5-aminotetrazole, exhibited the fourth highest polysilicon removal rate and fifth highest polysilicon-to-silicon nitride removal rate ratio among the tested chemical mechanical polishing compositions.

As another example, the results in Table 1.2 demonstrate that chemical mechanical polishing composition 1G containing an amine with structure (I), where X is a hydroxyl, Y is an amino group, and n=0, namely, monoethanolamine, and an azole with structure (II), namely, 5-aminotetrazole, exhibited the third highest polysilicon removal rate and fourth highest polysilicon-to-silicon nitride removal rate ratio among the tested chemical mechanical polishing compositions.

The results in Table 1.2. also show that chemical mechanical polishing composition 1H containing an amine with structure (I), where X is a hydroxyl, Y is an amino-group, and n=1, namely, 3-amino-1-propanol, and an azole with structure (II), namely, 5-aminotetrazole, exhibited the highest polysilicon removal rate and second highest polysilicon-to-silicon nitride removal rate ratio among the tested chemical mechanical polishing compositions.

The results in Table 1.2. also show that chemical mechanical polishing composition 1E containing an amine with structure (I), where X is a $CH_3$ group, Y is an amino-group, and n=0, namely, propylamine, and an azole with structure (II), namely, 5-aminotetrazole, exhibited the second highest polysilicon removal rate and the highest polysilicon-to-silicon nitride removal rate ratio among the tested chemical mechanical polishing compositions in this particular example.

Comparative chemical mechanical polishing compositions, such as C-1D, based on non-functionalized amines exemplified by amine 1D (isopropylamine) can yield a high polysilicon to silicon nitride removal rate ratio (polishing example P-1D, Table 1.2). However, the low boiling point of such amines and associated toxicity and fire hazard render these amines poorly suitable for chemical mechanical polishing composition applications.

The chemical mechanical polishing composition based on amine 1D (which has a very low boiling point) is included in this example for comparative purposes only. Once this amine is excluded, it is evident that chemical mechanical polishing composition 1G, based on a functionalized amine 1G with structure (I), where X is a hydroxyl, Y is an amino-group, and n=0, namely, monoethanolamine, exhibited polysilicon removal rates that are at least 25% higher, and the polysilicon to silicon nitride removal rate ratios that are at least 26% higher than the remaining comparative chemical mechanical polishing composition examples in Table 1.2. Similarly, the chemical mechanical polishing composition based on amine 1-H with structure (I), where X is a hydroxyl, Y is an amino-group, and n=1, namely, 3-amino-1-propanol, exhibited polysilicon removal rates that are at least 38% higher, and the polysilicon to silicon nitride removal rate ratios that are at least 47% higher than the comparative chemical mechanical polishing composition examples in Table 1.2. Further, the chemical mechanical polishing composition based on amine 1-F, i.e., 2-(2-aminoethoxy)ethanol exhibited polysilicon removal rates that are at least 16% higher, and the polysilicon to silicon nitride removal rate ratios that are at least 8% higher than the comparative chemical mechanical polishing composition examples in Table 1.2.

This example illustrates the advantages of some functionalized amines of structure (I), when used in combination with an azole of structure (II), in enhancement of polysilicon removal rates, when they are used in corresponding chemical mechanical polishing compositions, over other types of amines.

TABLE 1.1

| Example | Comp. | Amine | X | Y | n | Boiling Point of amine (° C.) |
|---|---|---|---|---|---|---|
| 1A | C-1A | 2-Methoxyethylamine | —OCH$_3$ | —NH$_2$ | 0 | 95 |
| 1B | C-1B | Gamma-Aminobutyric Acid | —CH$_2$COOH | —NH$_2$ | 0 | 248 |
| 1C | C-1C | 1-(3-Aminopropyl)imidazole | —CH$_2$(1-Imidazole) | —NH$_2$ | 0 | 296 |
| 1D | C-1D | Isopropylamine | —H | —NH$_2$ | 0 | 33 |
| 1E | 1E | Propylamine | —CH$_3$ | —NH$_2$ | 0 | 47 |
| 1F | 1F | 2-(2-Aminoethoxy)ethanol | —OCH$_2$CH$_2$OH | —NH$_2$ | 0 | 125 |
| 1G | 1G | Monoethanolamine (MEA) | —OH | —NH$_2$ | 0 | 170 |
| 1H | 1H | 3-Amino-1-propanol | —OH | —NH$_2$ | 1 | 184 |

1: Comp. = composition
2: Examples 1A-1D are comparative examples, and Examples 1E, 1F, 1G and 1H are examples of the disclosure.

TABLE 1.2

| Polishing Example | Polishing Composition | Polysilicon Removal Rate (Å/min) | Silicon Nitride Removal Rate (Å/min) | Polysilicon to Silicon Nitride Removal Rate Ratio |
|---|---|---|---|---|
| P-1A | C-1A | 6149 | 58 | 106 |
| P-1B | C-1B | 6691 | 73 | 92 |
| P-1C | C-1C | 7020 | 60 | 117 |
| P-1D | C-1D | 7262 | 49 | 148 |
| P-1E | 1E | 9153 | 43 | 213 |
| P-1F | 1F | 8161 | 65 | 126 |
| P-1G | 1G | 8801 | 60 | 147 |
| P-1H | 1H | 9696 | 56 | 172 |

Example 2

This example demonstrates the effect of a second amino group in the structure of functionalized amines (I) (e.g., when functional groups X and Y are both amino groups) on the polysilicon removal rates and polysilicon-to-silicon nitride selectivity.

Comparative chemical mechanical polishing compositions C-2A through C-2C, inventive chemical mechanical polishing compositions 2D through 2G, and inventive chemical mechanical polishing composition 1H (included in this example for comparison) each contained corresponding amine shown in Table 2.1, 5-aminotetrazole, aminotris (methanephosphonic acid), and high-purity colloidal silica. Enough nitric acid or potassium hydroxide (KOH) was added to adjust pH of the mixture to the final value of 10.8.

The polysilicon and silicon nitride removal rate polishing tests P-2A through P-2G, and polishing test P-1H were performed using chemical mechanical polishing compositions C-2A through C-2C, 2D through 2G and polishing composition 1H from Table 2.1. The polishing rates and selectivity ratio results are summarized in Table 2.2.

The example demonstrates that less substituted diamines with a structure (I), where both X and Y are amino-groups (amines 2D through 2G), exhibited at least 46% higher polysilicon removal rate and at least 117% higher silicon-to-silicon nitride removal rate ratio than the amines with structure (I), where X is a hydroxyl, Y is an amino-group, namely, inventive amine 1H. Moreover, highly substituted comparative diamines C-2A through C-2C exhibited at least 46% lower polysilicon removal rate than the non-substituted amine with structure (I), where X is a hydroxyl, and Y is an amino group, namely, inventive amine 1H.

The highest polysilicon removal rate among all comparative and inventive examples in Table 2.2 was demonstrated by inventive chemical mechanical polishing composition 2D based on non-substituted diamine 2D with structure (I), where both X and Y are amino groups, namely, ethylene diamine.

TABLE 2.1

| Ex. | Composition | Amine Name | X | Y | n | C1 Substituent | C2 Substituent | C3 Substituent |
|---|---|---|---|---|---|---|---|---|
| 2A | C-2A | N-(3-Aminopropyl) diethanolamine | —N(CH$_2$CH$_2$OH)$_2$ | —NH$_2$ | 1 | none | none | none |
| 2B | C-2B | N,N-Dimethyldipropylene triamine | —NHCH$_2$CH$_2$CH$_2$—N(CH$_3$)$_2$ | —NH$_2$ | 1 | none | none | none |
| 2C | C-2C | 1,2-Diaminocyclohexane | —NH$_2$ | —NH$_2$ | 0 | -Cyclohexyl (spanning C1, C2) | | n/a |
| 2D | 2D | Ethylene diamine | —NH$_2$ | —NH$_2$ | 0 | none | none | n/a |
| 2E | 2E | 2-(3-Aminopropylamino) ethanol | —NHCH$_2$CH$_2$OH | —NH$_2$ | 1 | none | none | none |
| 2F | 2F | 2,2-Dimethyl-1,3-propane diamine | —NH$_2$ | —NH$_2$ | 1 | none | —CH3, —CH3 | none |
| 2G | 2G | 1,3-Diaminopentane | —NH$_2$ | —NH$_2$ | 1 | —CH2CH3 | none | none |
| 1H | 1H | 3-Amino-1-propanol | —OH | —NH$_2$ | 1 | none | none | none |

*C1, C2, and C3 refer to the three carbons between groups X and Y in Structure (I).

TABLE 2.2

| Polishing Example | Polishing Composition | Polysilicon Removal Rate (Å/min) | Silicon Nitride Removal Rate (Å/min) | Polysilicon to Silicon Nitride Removal Rate Selectivity |
|---|---|---|---|---|
| P-2A | C-2A | 1720 | 5 | 344 |
| P-2B | C-2B | 6147 | 20 | 307 |
| P-2C | C-2C | 6629 | 34 | 195 |
| P-2D | 2D | 11998 | 81 | 148 |
| P-2E | 2E | 10106 | 27 | 374 |
| P-2F | 2F | 10384 | 25 | 415 |
| P-2G | 2G | 10395 | 14 | 743 |
| P-1H | 1H | 9696 | 56 | 172 |

Example 3

This example demonstrates the synergistic effect between amine 1G of structure (I), where X is hydroxyl, and Y is amino (namely, monoethanolamine), and azole 1G' with structure (II), where $R_7$ is amino, $Z_1$ is a nitrogen atom, $Z_2$ is a nitrogen atom, and $Z_3$ is a carbon atom (namely, 5-aminotetrazole), on the polysilicon removal rates and polysilicon-to-silicon nitride removal rate selectivity ratios observed in polishing example P-1G as shown in Table 3.1.

The synergy is evident when the results of polishing examples P-3A and P-3B are compared with the result of polishing example P-1G (which is included in Table 3.1 for comparison and is based on composition 1G).

Referring to Table 3.1, comparative chemical mechanical polishing compositions C-3A and C-3B, and inventive chemical mechanical polishing composition 1G each contained aminotris(methanephosphonic acid), high-purity colloidal silica, and enough KOH to adjust pH of the mixture to the final value of 10.8. In addition, composition C-3A contained amine 1G (1-aminoethanol) but did not contain any azole compound; composition C-3B contained azole (5-aminotetrazole) but did not contain any amine compound; and composition 1G contained both amine 1G (1-aminoethanol) and azole (5-aminotetrazole monohydrate) as can be seen in Table 3.1. Conductivity of compositions C-3A and C-3B were similar to conductivity of composition 1G. The polysilicon and silicon nitride polishing tests P-3A, P-3B, and P-1G in Table 3.1 were performed using compositions C-3A, C-3B, and 1G. The results of the polishing tests are summarized in Table 3.1.

The example demonstrates that omission of either amine 1G (1-aminoethanol) or azole (5-aminotetrazole) from the contents of a chemical mechanical composition (compositions C-3B and C-3A, respectively), resulted in a loss of polysilicon removal rate when the composition was used in a polishing example (polishing examples P-3B and P-3A, respectively), even though the ionic strength/conductivity of the compositions were similar to that of polishing composition 1G, which contained both components.

The mechanism of this unexpected synergistic interaction between an amine and an azole is not clear, but it is evident that the values of polysilicon removal rate and polysilicon-to-silicon nitride removal rate selectivity, obtained from composition 1G containing both amine 1G and azole, are at least 34% and 15% higher, respectively, than the highest corresponding values of polysilicon removal rate and polysilicon-to-silicon nitride removal rate selectivity (see P-3A and P-3B), obtained from compositions C-3A and C-3B, where one of the two components was omitted (Table 3.1).

TABLE 3.1

| Polishing Example | Polishing Composition | Amine 1G present | Azole 1G' present | Slurry Conductivity (mS/cm) | Polysilicon Removal Rate (Å/min) | Silicon Nitride Removal Rate (Å/min) | Polysilicon to Silicon Nitride Removal Rate Selectivity |
|---|---|---|---|---|---|---|---|
| P-3A | C-3A | Yes | No | 5.4 | 6549 | 51 | 128 |
| P-3B | C-3B | No | Yes | 5.9 | 3537 | 59 | 60 |
| P-1G | 1G | Yes | Yes | 5.6 | 8801 | 60 | 147 |

Example 4

This example demonstrates the effect of the structure of various azoles (4 Å' through 4F', Table 4.1) on the polysilicon removal rates and polysilicon-to-silicon nitride removal rate ratios, observed in polishing examples P-4A through P-4F (Table 4.2), when the azoles are used in combination with amine 1-G (2-aminoethanol) in a chemical mechanical polishing composition.

Furthermore, this example demonstrates the advantages of using azole/azole derivatives of structure II (as tabulated in Table 4.1) wherein $R_7$ is H, COOH, C1-C3 alkyl, or $N(R_9)_2$, in which each $R_9$, independently, is H or $C_1$-$C_3$ alkyl; provided that, when $Z_3$ is —N—, $R_7$ is deleted (as detailed in Claim 1). As can be seen in Table 4.1, the group in azole 4A' that corresponds to $R_7$ is phenyl. As such, azole 4A' is not a compound of Structure (II). Surprisingly, azole 4A' shows a much lower polysilicon removal rate and a much lower polysilicon-to-silicon nitride removal rate ratio than azole 4B'-4F' (see Table 4.2), which are compounds of Structure (II).

The polishing compositions were prepared in a similar fashion as other examples. Similarly, the polysilicon and silicon nitride polishing tests were performed in polishing examples P-4A through P-4F, and polishing test results of example P-1G (from Table 1.2) are included in Table 4.2 for comparison.

The polishing results summarized in Table 4.2 clearly show the advantages of using a compound with Structure (I) in combination with an azole/azole derivative having Structure (II). The synergistic effect of these compounds in enhancing P—Si removal rates and P—Si to SiN selectivities can be clearly seen in Table 4.2. As can be seen, comparative example P-4A has the lowest P—Si removal rates and the lowest P—Si to SiN selectivity in Table 4.2. All the inventive examples (P-4B through P-4F and P-1G) have much higher P—Si removal rates and P—Si to SiN removal rate ratios. In fact, composition P-4C containing azole 4C (1, 2, 4-triazole) has a 40% higher P—Si removal rates than the comparative example P-1A. Furthermore, composition P-4B containing azole 4B' (Imidazole) has a 70% higher P—Si to SiN removal rate ratio than the comparative example P-1A.

The example demonstrates that inventive polishing composition 5A containing taurine provided an at least 3% improvement in terms of polysilicon removal rate over inventive composition 1G (without any additional components), and provided comparable polysilicon-to-silicon nitride removal rate ratio, when these compositions were used in polishing tests P-5A and P-1G, respectively. The

TABLE 4.1

| Azole | Polishing Composition | Azole Name | Z1 | Z2 | Z3 | R7 |
|---|---|---|---|---|---|---|
| 4A' | C-4A (comparative) | 5-Pheny-1H-tetrazole | N | N | C | -Phenyl |
| 4B' | 4B | Imidazole | C | C | C | —H |
| 4C' | 4C | 1,2,4-triazole (TAZ) | C | N | C | —H |
| 4D' | 4D | Benzotriazole (BTA) | Benzene: an adjacent 6 N membered cyclic ring (spanning Z1 and Z2) | | | since Z3 is —N—, R7 is deleted |
| 4E' | 4E | 3,5-Diamino-1,2,4-triazole | C—$NH_2$ | N | C | —$NH_2$ |
| 4F' | 4F | 1,2,4-Triazole-3-carboxylic acid | C—COOH | N | C | —H |
| 1G' | 1G | 5-Aminotetrazole (ATA) | N | N | C | —$NH_2$ |

TABLE 4.2

| Polishing Example | Polishing Composition | Azole Name | Polysilicon Removal Rate (Å/min) | Silicon Nitride Removal Rate (Å/min) | Polysilicon to Silicon Nitride Removal Rate Selectivity |
|---|---|---|---|---|---|
| P-4A | C-4A (comparative) | 5-Phenyl-1H-tetrazole | 6633 | 70 | 95 |
| P-4B | 4B | Imidazole | 9057 | 56 | 161 |
| P-4C | 4C | 1,2,4-triazole (TAZ) | 9258 | 64 | 144 |
| P-4D | 4D | Benzotriazole (BTA) | 8625 | 65 | 132 |
| P-4E | 4E | 3,5-Diamino-1,2,4-triazole | 8791 | 64 | 137 |
| P-4F | 4F | 1,2,4-Triazole-3-carboxylic acid | 9118 | 76 | 120 |
| P-1G | 1G | 5-Aminotetrazole (ATA) | 8801 | 60 | 147 |

Example 5

The example demonstrates the effect of additional components on polysilicon removal rate and polysilicon-to-silicon nitride removal rate ratio in polishing compositions closely related to inventive composition 1G (Table 5.1). The example demonstrates that additives such as taurine and choline hydroxide, can substantially enhance polysilicon removal rate (as shown in polishing examples P-5A and P-5B, respectively). In addition, choline hydroxide (5B) dramatically enhances the polysilicon-to-silicon nitride removal rate ratio (as shown in polishing example P-5B).

Inventive chemical mechanical polishing compositions 5A, 5B, and 1G listed in Table 5.1 each contained amine 1-G (monoethanolamine), azole (5-aminotetrazole), aminotris (methanephosphonic acid, high-purity colloidal silica, and enough KOH or nitric acid to adjust the pH of the mixture to the final value of 10.8. In addition, composition 5A contained taurine, and composition 5B contained choline hydroxide. Polishing tests P-5A, P-5B and P-1G were performed according to the standard protocol described above. The results are summarized in Table 5.1.

example also demonstrates that inventive polishing composition 5B containing choline hydroxide provided at least 25% enhancement of polysilicon removal rate and 370% enhancement of polysilicon-to-silicon nitride removal rate ratio over inventive composition 1G (without any additional components), when these compositions were used in polishing tests P-5B and P-1G, respectively.

In addition, Table 5.1 presents a summary of the colloidal stability data collected on inventive compositions 5A, 5B, and 1G prepared as 2× concentrates and subjected to accelerated aging conditions (60° C. oven, 3 weeks). The slurries were classified as "stable" if the growth of mean particle size (MPS) measured by dynamic light scattering (DLS) was <5 nm at the end of the test period, and "unstable" if the MPS growth was found to be >5 nm. MPS can be measured using DLS tools such as Malvern Zetasizer from Malvern Instruments. The results of the colloidal stability testing demonstrated that the 2× concentrate of inventive composition 1G (which contained no additional components), as well as inventive compositions 5A and 5B, were all found to be stable.

TABLE 5.1

| Polishing Example | Polishing Composition | Additive Name | Polysilicon Removal Rate (Å/min) | Silicon Nitride Removal Rate (Å/min) | Polysilicon to Silicon Nitride Removal Selectivity | Colloidal Stability of 2X Concentrate |
|---|---|---|---|---|---|---|
| P-5A | 5A | Taurine | 9125 | 66 | 138 | stable |
| P-5B | 5B | Choline Hydroxide | 11042 | 16 | 690 | stable |
| P-1G | 1G | None | 8801 | 60 | 147 | stable |

While this disclosure has been described with respect to the examples set forth herein, it is understood that other modifications and variations are possible without departing from the spirit and scope of the disclosure as defined in the appended claims.

What is claimed is:

1. A chemical mechanical polishing composition, comprising
   1) at least one abrasive;
   2) at least one compound of structure (I):

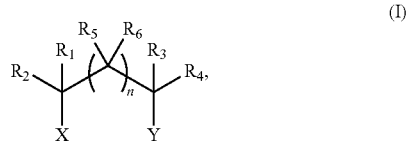

wherein:
   n is 0, 1, 2, or 3;
   each of X and Y, independently, is $O(R_a)$, $CH_2(R_a)$, or $NH(R_a)$, in which each $R_a$, independently, is H or $C_1$-$C_2$ alkyl optionally substituted by hydroxyl or $NH_2$, provided that at least one of X and Y is $O(R_a)$ or $NH(R_a)$ and that, when one of X and Y is $NH(R_a)$, the other of X and Y is $O(R_a)$ or $NH(R_a)$; and
   each of $R_1$-$R_6$, independently, is H, OH, or $C_1$-$C_3$ alkyl optionally substituted by OH or $NH_2$;
   provided that the at least one compound of structure (I) is not diethanolamine;
   3) at least one compound of structure (II):

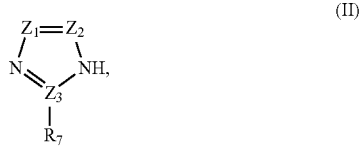

wherein
   each of $Z_1$ and $Z_2$, independently, is —$CR_8$— or —N—, in which $R_8$ is H, $N(R_b)_2$, COOH, $C_1$-$C_3$ alkyl; each $R_b$, independently, being H or $C_1$-$C_3$ alkyl; or $Z_1$ and $Z_2$ together form a 5-6 membered ring fused with the 5-membered ring in Structure (II);
   $Z_3$ is —C— or —N—; and
   $R_7$ is H, COOH, $C_1$-$C_3$ alkyl, or $N(R_9)_2$, in which each $R_9$, independently, is H or $C_1$-$C_3$ alkyl; provided that, when $Z_3$ is —N—, $R_7$ is deleted; and
   4) water;
   wherein the composition does not include tetramethylammonium hydroxide or a salt thereof, the composition does not include an oxidizing agent, and the composition has a polysilicon-to-silicon nitride removal rate ratio of at least about 50:1.

2. The composition of claim 1, wherein the composition has a polysilicon-to-silicon nitride removal rate ratio of at most about 200:1.

3. The composition of claim 1, wherein the composition has a polysilicon removal rate of at least about 8000 Å/minute.

4. The composition of claim 1, wherein the compound of structure (I) is an aminoalcohol.

5. The composition of claim 4, wherein the compound of structure (I) is selected from the group consisting of monoethanolamine, 1-amino-2-propanol, 1-amino-2-butanol, 1,3-diamino-2-propanol, 3-amino-1,2-propanediol, 3-amino-1-propanol, 2-(2-aminoethoxy)ethanol, 2-amino-3-methyl-1-butanol, and 5-amino-1-pentanol.

6. The composition of claim 1, wherein the compound of structure (I) is a diamine.

7. The composition of claim 6, wherein the compound of structure (I) is selected from the group consisting of 2,2-dimethyl-1,3-propane diamine, 1,3-diaminopentane, and 2-(3-aminopropylamino)ethanol.

8. The composition of claim 1, wherein, when n is 0 and each of $R_1$-$R_4$ is H, at least one of X and Y is OH.

9. The composition of claim 1, wherein the compound of structure (I) is in an amount of from about 0.1 wt % to about 15 wt % of the composition.

10. The composition of claim 1, wherein the compound of structure (II) is an imidazole or a triazole.

11. The composition of claim 10, wherein the compound of structure (II) is selected from the group consisting of imidazole, 1,2,4-triazole, 3-amino 1,2,4-triazole, benzotriazole, 3,5-diamino-1,2,4-triazole, and 1,2,4-triazole-3-carboxylic acid.

12. The composition of claim 1, wherein the compound of structure (II) is a tetrazole.

13. The composition of claim 12, wherein the compound of structure (II) is 5-(aminomethyl)tetrazole, 5-methyl-1H-tetrazole, 5-aminotetrazole, a hydrate thereof.

14. The composition of claim 1, wherein the compound of structure (II) is in an amount of from about 0.1 wt % to about 15 wt % of the composition.

15. The composition of claim 1, wherein the abrasive is selected from the group consisting of alumina, fumed silica, colloidal silica, coated particles, titania, ceria, zirconia, and any combinations thereof.

16. The composition of claim 15, wherein the abrasive is colloidal silica.

17. The composition of claim 1, wherein the abrasive is in an amount of from about 0.05 wt % to about 20 wt % of the composition.

18. The composition of claim 1, wherein the composition further comprises a pH adjusting agent.

19. The composition of claim 1, wherein the composition further comprises a salt containing a sulphonate group, an amino group, a carboxylate group, or a tetralkylammonium group, the salt being different from a salt of tetramethylammonium hydroxide.

20. The composition of claim 19, wherein the salt is selected from the group consisting of amino acids, taurine, and choline hydroxide.

21. The composition of claim 19, wherein the salt is in an amount of from about 0.05 wt % to about 5 wt % of the composition.

22. The composition of claim 1, wherein the composition further comprises an aminophosphonic acid.

23. The composition of claim 22, wherein the aminophosphonic acid is amino(trimethylenephosphonic acid).

24. The composition of claim 22, wherein the aminophosphonic acid is in an amount of from about 0.01 wt % to about 5 wt % of the composition.

25. The composition of claim 1, wherein the composition has a pH of from about 7 to about 12.

26. The composition of claim 1, wherein the composition does not include a bicarbonate salt.

27. A chemical mechanical polishing composition, comprising
1) at least one abrasive comprising colloidal silica;
2) at least one compound of structure (I):

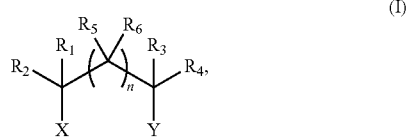

(I)

wherein:
n is 0, 1, 2, or 3;
each of X and Y, independently, is O($R_a$), $CH_2$($R_a$), or NH($R_a$), in which each $R_a$, independently, is H or $C_1$-$C_3$ alkyl optionally substituted by hydroxyl or $NH_2$, provided that at least one of X and Y is O($R_a$) or NH($R_a$) and that, when one of X and Y is NH($R_a$), the other of X and Y is O($R_a$) or NH($R_a$); and
each of $R_1$-$R_6$, independently, is H, OH, or $C_1$-$C_3$ alkyl optionally substituted by OH or $NH_2$;
provided that the at least one compound of structure (I) is not diethanolamine;
3) at least one compound of structure (II):

(II)

wherein
each of $Z_1$ and $Z_2$, independently, is —$CR_8$— or —N—, in which $R_8$ is H, N($R_b$)$_2$, COOH, $C_1$-$C_3$ alkyl; each $R_b$, independently, being H or $C_1$-$C_3$ alkyl; or $Z_1$ and $Z_2$ together form a 5-6 membered ring fused with the 5-membered ring in Structure (II);
$Z_3$ is —C— or —N—; and
$R_7$ is H, COOH, $C_1$-$C_3$ alkyl, or N($R_9$)$_2$, in which each $R_9$, independently, is H or $C_1$-$C_3$ alkyl; provided that, when $Z_3$ is —N—, $R_7$ is deleted; and
4) water;

wherein the composition does not include tetramethylammonium hydroxide or a salt thereof, the composition does not include an oxidizing agent, and the composition has a polysilicon-to-silicon nitride removal rate ratio of at least about 50:1.

28. The composition of claim 27, wherein the composition has a polysilicon-to-silicon nitride removal rate ratio of at most about 200:1.

29. The composition of claim 27, wherein the composition has a polysilicon removal rate of at least about 8000 Å/minute.

30. The composition of claim 27, wherein the compound of structure (I) is an aminoalcohol.

31. The composition of claim 30, wherein the compound of structure (I) is selected from the group consisting of monoethanolamine, 1-amino-2-propanol, 1-amino-2-butanol, 1,3-diamino-2-propanol, 3-amino-1,2-propanediol, 3-amino-1-propanol, 2-(2-aminoethoxy)ethanol, 2-amino-3-methyl-1-butanol, and 5-amino-1-pentanol.

32. The composition of claim 27, wherein the compound of structure (I) is a diamine.

33. The composition of claim 32, wherein the compound of structure (I) is selected from the group consisting of 2,2-dimethyl-1,3-propane diamine, 1,3-diaminopentane, and 2-(3-aminopropylamino)ethanol.

34. The composition of claim 27, wherein, when n is 0 and each of $R_1$-$R_4$ is H, at least one of X and Y is OH.

35. The composition of claim 27, wherein the compound of structure (I) is in an amount of from about 0.1 wt % to about 15 wt % of the composition.

36. The composition of claim 27, wherein the compound of structure (II) is an imidazole or a triazole.

37. The composition of claim 36, wherein the compound of structure (II) is selected from the group consisting of imidazole, 1,2,4-triazole, 3-amino 1,2,4-triazole, benzotriazole, 3,5-diamino-1,2,4-triazole, and 1,2,4-triazole-3-carboxylic acid.

38. The composition of claim 27, wherein the compound of structure (II) is a tetrazole.

39. The composition of claim 38, wherein the compound of structure (II) is 5-(aminomethyl)tetrazole, 5-methyl-1H-tetrazole, 5-aminotetrazole, a hydrate thereof.

40. The composition of claim 27, wherein the compound of structure (II) is in an amount of from about 0.1 wt % to about 15 wt % of the composition.

41. The composition of claim 27, wherein the abrasive is in an amount of from about 0.05 wt % to about 20 wt % of the composition.

42. The composition of claim 27, wherein the composition further comprises a pH adjusting agent.

43. The composition of claim 27, wherein the composition further comprises a salt containing a sulphonate group, an amino group, a carboxylate group, or a tetralkylammonium group, the salt being different from a salt of tetramethylammonium hydroxide.

44. The composition of claim 43, wherein the salt is selected from the group consisting of amino acids, taurine, and choline hydroxide.

45. The composition of claim 43, wherein the salt is in an amount of from about 0.05 wt % to about 5 wt % of the composition.

46. The composition of claim 27, wherein the composition further comprises an aminophosphonic acid.

47. The composition of claim 46, wherein the aminophosphonic acid is amino(trimethylenephosphonic acid).

48. The composition of claim 46, wherein the aminophosphonic acid is in an amount of from about 0.01 wt % to about 5 wt % of the composition.

49. The composition of claim 27, wherein the composition has a pH of from about 7 to about 12.

50. The composition of claim 27, wherein the composition does not include a bicarbonate salt.

51. A chemical mechanical polishing composition, consisting of:
1) at least one abrasive;
2) at least one compound of structure (I):

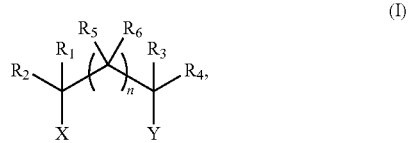

wherein:
n is 0, 1, 2, or 3;
each of X and Y, independently, is $O(R_a)$, $CH_2(R_a)$, or $NH(R_a)$, provided that at least one of X and Y is $O(R_a)$ or $NH(R_a)$, in which each $R_a$, independently, is H or $C_1$-$C_3$ alkyl optionally substituted by hydroxyl or $NH_2$, and
each of $R_1$-$R_6$, independently, is H, OH, or $C_1$-$C_3$ alkyl optionally substituted by OH or $NH_2$;
3) at least one compound of structure (II):

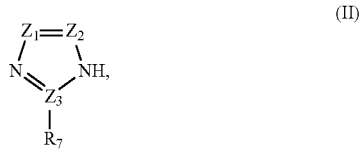

wherein
each of $Z_1$ and $Z_2$, independently, is —$CR_8$— or —N—, in which $R_8$ is H, $N(R_b)_2$, COOH, $C_1$-$C_3$ alkyl; each $R_b$, independently, being H or $C_1$-$C_3$ alkyl; or $Z_1$ and $Z_2$ together form a 5-6 membered ring fused with the 5-membered ring in Structure (II);
$Z_3$ is —C— or —N—; and
$R_7$ is H, COOH, $C_1$-$C_3$ alkyl, or $N(R_9)_2$, in which each $R_9$, independently, is H or $C_1$-$C_3$ alkyl; provided that, when $Z_3$ is —N—, $R_7$ is deleted;
4) at least one tetralkylammonium salt, the at least one tetralkylammonium salt being different from a salt of tetramethylammonium hydroxide;
5) at least one base;
6) at least one amino acid; and
7) water.

52. The composition of claim 51, wherein the composition has a polysilicon-to-silicon nitride removal rate ratio of at most about 50:1.

53. The composition of claim 51, wherein the composition has a polysilicon-to-silicon nitride removal rate ratio of at most about 200:1.

54. The composition of claim 51, wherein the composition has a polysilicon removal rate of at least about 8000 Å/minute.

55. The composition of claim 51, wherein the compound of structure (I) is an aminoalcohol.

56. The composition of claim 55, wherein the compound of structure (I) is selected from the group consisting of monoethanolamine, diethanolamine, 1-amino-2-propanol, 1-amino-2-butanol, 1,3-diamino-2-propanol, 3-amino-1,2-propanediol, 3-amino-1-propanol, 2-(2-aminoethoxy)ethanol, 2-amino-3-methyl-1-butanol, and 5-amino-1-pentanol.

57. The composition of claim 51, wherein the compound of structure (I) is a diamine.

58. The composition of claim 57, wherein the compound of structure (I) is selected from the group consisting of 2,2-dimethyl-1,3-propane diamine, 1,3-diaminopentane, and 2-(3-aminopropylamino)ethanol.

59. The composition of claim 51, wherein, when n is 0 and each of $R_1$-$R_4$ is H, at least one of X and Y is OH.

60. The composition of claim 51, wherein the compound of structure (I) is in an amount of from about 0.1 wt % to about 15 wt % of the composition.

61. The composition of claim 51, wherein the compound of structure (II) is an imidazole or a triazole.

62. The composition of claim 61, wherein the compound of structure (II) is selected from the group consisting of imidazole, 1,2,4-triazole, 3-amino 1,2,4-triazole, benzotriazole, 3,5-diamino-1,2,4-triazole, and 1,2,4-triazole-3-carboxylic acid.

63. The composition of claim 51, wherein the compound of structure (II) is a tetrazole.

64. The composition of claim 63, wherein the compound of structure (II) is 5-(aminomethyl)tetrazole, 5-methyl-1H-tetrazole, 5-aminotetrazole, a hydrate thereof.

65. The composition of claim 51, wherein the compound of structure (II) is in an amount of from about 0.1 wt % to about 15 wt % of the composition.

66. The composition of claim 51, wherein the abrasive is selected from the group consisting of alumina, fumed silica, colloidal silica, coated particles, titania, ceria, zirconia, and any combinations thereof.

67. The composition of claim 66, wherein the abrasive is colloidal silica.

68. The composition of claim 51, wherein the abrasive is in an amount of from about 0.05 wt % to about 20 wt % of the composition.

69. The composition of claim 51, wherein the tetralkylammonium salt is in an amount of from about 0.05 wt % to about 5 wt % of the composition.

70. The composition of claim 51, wherein the composition has a pH of from about 7 to about 12.

\* \* \* \* \*

UNITED STATES PATENT AND TRADEMARK OFFICE
CERTIFICATE OF CORRECTION

PATENT NO. : 11,499,071 B2
APPLICATION NO. : 16/832739
DATED : November 15, 2022
INVENTOR(S) : Alexei P. Leonov and Abhudaya Mishra It is certified that error appears in the above-identified patent and that said Letters Patent is hereby corrected as shown below:

In the Claims

Column 21
Line 3, in Claim 19, delete "tetralkylammonium" and insert -- tetraalkylammonium --

Column 22
Lines 55-56, in Claim 43, delete "tetralkylammonium" and insert -- tetraalkylammonium --

Column 23
Line 50, in Claim 51, delete "tetralkylammonium" and insert -- tetraalkylammonium --
Line 51, in Claim 51, delete "tetralkylammonium" and insert -- tetraalkylammonium --

Column 24
Lines 53-54, in Claim 69, delete "tetralkylammonium" and insert -- tetraalkylammonium --

Signed and Sealed this
Tenth Day of January, 2023

Katherine Kelly Vidal
*Director of the United States Patent and Trademark Office*